United States Patent
Bill

(10) Patent No.: US 9,548,131 B1
(45) Date of Patent: Jan. 17, 2017

(54) REDUCED POWER READ SENSING FOR ONE-TIME PROGRAMMABLE MEMORIES

(71) Applicant: Kilopass Technology, Inc., San Jose, CA (US)

(72) Inventor: Colin Stewart Bill, Cupertino, CA (US)

(73) Assignee: Kilopass Technology, Inc., San Jose, CA (US)

(*) Notice: Subject to any disclaimer, the term of this patent is extended or adjusted under 35 U.S.C. 154(b) by 0 days.

(21) Appl. No.: 15/152,463

(22) Filed: May 11, 2016

Related U.S. Application Data

(60) Provisional application No. 62/195,168, filed on Jul. 21, 2015.

(51) Int. Cl.
G11C 17/00 (2006.01)
G11C 17/18 (2006.01)
G11C 17/16 (2006.01)

(52) U.S. Cl.
CPC .............. G11C 17/18 (2013.01); G11C 17/16 (2013.01)

(58) Field of Classification Search
CPC . G11C 11/5628; G11C 16/10; G11C 16/3459; G11C 13/0028; G11C 13/004; G11C 16/26
See application file for complete search history.

(56) References Cited

U.S. PATENT DOCUMENTS

| | | | | |
|---|---|---|---|---|
| 5,680,347 A * | 10/1997 | Takeuchi | ................. | G11C 7/12 365/185.05 |
| 6,882,567 B1 * | 4/2005 | Wong | ................... | G11C 11/5628 365/185.03 |
| 2001/0015912 A1 * | 8/2001 | Matsubara | ......... | G11C 16/0416 365/185.29 |
| 2014/0254242 A1 * | 9/2014 | Siau | ................... | G11C 13/0026 365/148 |

* cited by examiner

Primary Examiner — Tuan T Nguyen
(74) Attorney, Agent, or Firm — Aka Chan LLP

(57) ABSTRACT

A low power consuming read circuit for a memory array is disclosed. The circuit is particularly useful in applications where oxide breakdown one-time programmable memory is integrated into a system having low power available from the power sources supplying the system.

13 Claims, 2 Drawing Sheets

Peak Power Limited Read Sensing Circuit

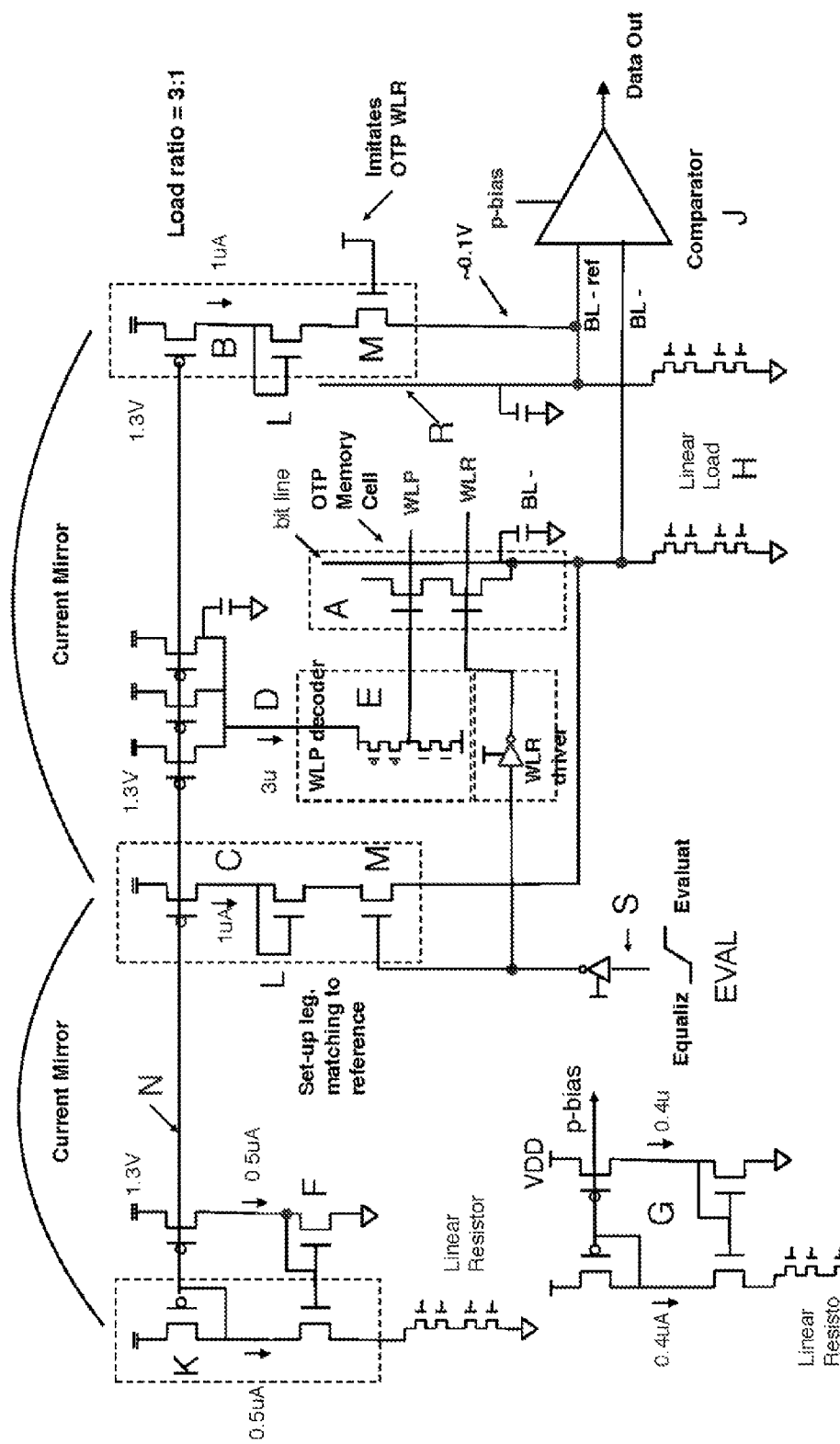
Figure 1 Peak Power Limited Read Sensing Circuit

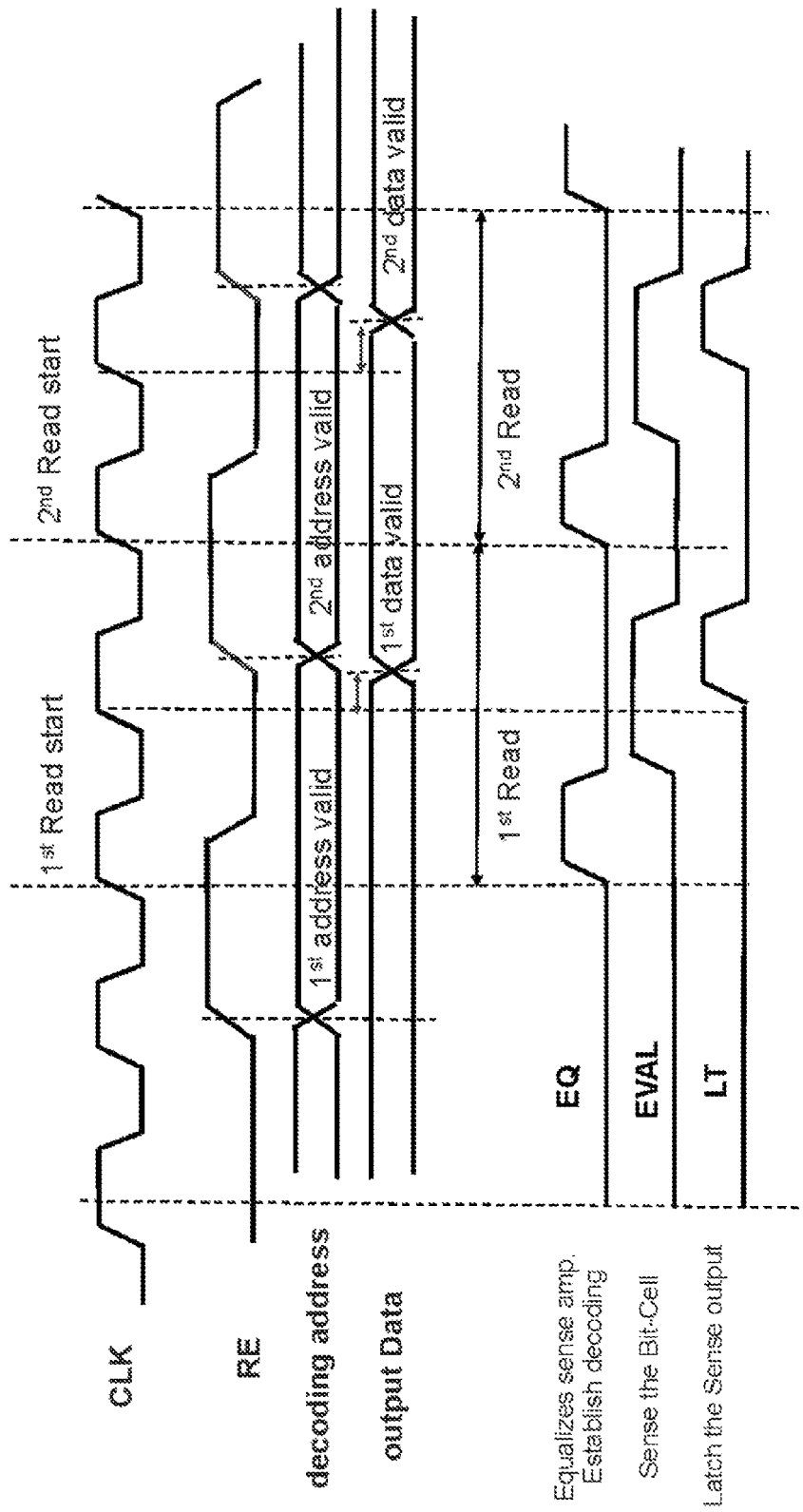
Figure 2 Read Circuit Clocking

REDUCED POWER READ SENSING FOR ONE-TIME PROGRAMMABLE MEMORIES

CROSS-REFERENCE TO RELATED APPLICATIONS

This patent application claims priority from U.S. Provisional Patent Application No. 62/195,168, filed Jul. 21, 2015, and entitled, "Low-Power Read for OTP Memory Arrays," which is incorporated by reference herein.

BACKGROUND OF THE INVENTION

This invention is related to integrated circuit memories, and in particular to one-time programmable memories, often referred to as OTP Memory. Nonvolatile memory retains stored data when power is removed, and is used in many different applications. As system-on-chip (SoC) technology becomes more prevalent in consumer electronics and industrial applications, embedded nonvolatile memories have become more common. Embedded memory is included on the same semiconductor die with other non-memory circuitry, typically logic circuitry.

An embedded memory can be used for various purposes, for example, providing chip IDs, analog trimming, yield enhancement, code storage, etc. It is advantageous if the embedded memory does not require added masks or other process modifications to a standard CMOS process flow. Flash NAND or NOR memory using multiple polysilicon layers is not compatible with standard CMOS processing. Gate dielectric based anti-fuse memory increasingly has become the choice of SoC chip designers because it can be included on the chip using standard CMOS processes, and it is reliable and secure.

Gate dielectric anti-fuse based memory can be broadly categorized into two types, depending upon its operating principle. One type is cross-point memory consisting of a single capacitor at each grid point. The second type has more than two access lines for each cell in the memory array. A typical example is a storage capacitor or transistor coupled in series with a selection device such as a transistor or diode.

Cross-point memory arrays are advantageous due to their compact layout and simple decoding. As a result, embedded OTP memories of the first type can be about eight times smaller than those of the second type. One cross-point memory is described in commonly assigned U.S. patent application Ser. No. 14/250,267 filed Apr. 10, 2014, and entitled "One-Time Programmable Memory and Method for Making the Same."

One challenge to OTP memory is reducing the amount of power consumed by such memories, e.g. for battery powered applications, or other applications where low power consumption is advantageous. In OTP memories relying upon oxide breakdown, after breakdown the memory typically has a relatively low oxide resistance, for example, between 10 K ohms and 100 K ohms. Typically, for a memory array there is a resistance distribution where some cells are seen with the resistance at the lowest end of the range (10 K Ohms or possibly lower). These low resistance cells inherently consume significant power during the sensing operation.

In reading data from such memories, the content of each addressed cell is read producing either a '0' (not programmed) or a '1' (programmed, oxide is broken-down). The result is output from the sensing circuit as a bit of data. There is a need, especially in low power systems, to sense the state of the OTP memory cell utilizing low total power dissipation, despite the OTP memory cell having a low resistance and potentially consuming high power were traditional sensing means used.

BRIEF SUMMARY OF THE INVENTION

The circuit and method of operation described herein enable sensing one-time memory cell content while dissipating low total power. In a preferred embodiment the sensing circuit provides for reading data from one-time programmable memory cells, each memory cell being connected to a program word line, a read word line and a bit line. The sensing circuit includes a first bias circuit and a second bias circuit, each coupled between a first higher potential and a second lower potential for providing first and second mirrored reference currents between the first higher potential and the second lower potential. The first bias circuit is coupled to a reference terminal of a differential sense amplifier, and the second bias circuit is coupled to a data terminal of the differential sense amplifier. In response to a control signal in a first state, the first and second bias circuits equilibrate the differential sense amplifier.

The sensing circuit further includes a third bias circuit coupled between the first higher potential and the program word line for providing a limited current to the program word line, and a read word line driver circuit coupled to the read word line. The read word line driver circuit is connected to receive the control signal. When the control signal is in a logic state opposite the first state, the memory cell is coupled to the data terminal of the differential sense amplifier and the third bias circuit limits current through the memory cell.

In a typical embodiment the sensing circuit includes a fourth bias circuit coupled to the first higher potential, the first node, and the program word line. The fourth bias circuit limits the channel current in the memory cell during an evaluation function.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 1 is a circuit schematic of a read sensing circuit for a one-time programmable memory.

FIG. 2 is a timing diagram for some of the signals used in FIG. 1.

DETAILED DESCRIPTION OF THE INVENTION

The low power consuming read circuit of this invention is particularly useful in applications where oxide breakdown one-time programmable memory is integrated into a system having low power available from the power source supplying the system. The invention can also be used with other memory types that have a low resistance state and thus would normally consume power beyond the capability of the power source. Examples of such memory include resistive random access memory (ReRAM or RRAIVI), magneto-resistive random-access memory (MRAM), phase-change memory (PCRAM), as well as other types of memories. A preferred implementation described herein is a one-time programmable memory read circuit that consumes about 6 uW of power during sensing of a memory cell state. An advantage of the circuit described here is that it enables use of an OTP memory array in systems such as those powered by harvesting RF-field power (e.g. RFID), which typically provide a very low available power source. Another advantage is the circuit and operation described here may be used in any system where minimum power consumption is required, such as mobile hand-held electronic devices.

A preferred embodiment of the circuit of this invention is shown in FIG. 1. This circuit may be fabricated using established integrated circuit technology, e.g. in the preferred embodiment, a well-known 14 nm finFET process. In FIG. 1 an exemplary one-time programmable memory cell A is illustrated. In a typical implementation there will be an array of such memory cells. Memory cell A is connected to a word line for writing data (WLP), a word line for reading the stored data (WLR), and a bit line (BL) over which the '1' or '0' stored in the memory cell is provided to a differential sense amplifier J. The differential sense amplifier J amplifies any difference in voltage between its two input nodes, a first node coupled to the memory cell to be read (BL-data) and a second node coupled to a reference voltage (BL-ref) and provides that amplified signal as output data (Data Out). A bias circuit G connected to a power supply VDD sets up a low current p-bias signal that is provided to the differential sense amplifier J. The p-bias current is about 0.4 uA, and controls a total current of about 1.4 uA in sense amplifier J.

In FIG. 1, a bias circuit F sets up a low reference current in p-channel device K, for example, a current of 0.5 uA. This current is mirrored into all the other p-channel devices connected to node N. Current amplification using p-channel device geometry establishes a current of about 1 uA in the leg B of a bias circuit B and a bias circuit C. The three parallel p-channel devices, coupled to node N between legs B and C, establish a current of about 3 uA in leg D, once the memory cell A is turned on by signals on lines WLR and WLP, assuming the OTP memory cell A is in a programmed state.

Decoder circuit E controls line WLP. In the bias legs B and C, the transistors designated L and M are inserted to partly imitate the characteristic of the memory cell A program state. Each of transistors L in legs B and C have a threshold voltage characteristic similar to, but need not be the same as, memory cell A. Transistors M have a similar characteristic to the selection transistor coupled to line WLR in memory cell A. Using these transistors causes the electrical characteristic of the legs B and C to perform similar to those in leg D, and device M provides a means to turn off leg C. In operation, one of leg C or D is enabled, but never both. Due to legs B and C being identical and also being similar to leg D, when leg C is off and circuit D is on (OTP in on-state), the node voltages in D are similar to C and B. This helps smooth the transition when turning off C and turning on D and also helps the 3-p-channel loads on D generate the 3 uA bias more accurately based on the 3-p-channel load geometry. Thus device 'M' imitates the characteristic of the WLR device in the D leg, and M gate is tied to VDD as per the WLR device, when selected. Legs B and C are matched to each other, but leg D is not required to match legs B and C precisely. The p-channel loads, however, in legs B, C and D are matched to each other.

Circuit E is the wordline decoder for memory cell A and is repeated once for each word line WLP in the memory cell array. Transistor group D provides about 3 uA maximum current to the word line decoder E, and this current ultimately flows through memory cell A when it is in an on (programmed) state. The transistor group D limits the peak current in the memory cell to be significantly lower than in a traditional OTP read sensing circuit, thus saving significant power.

In use, the sensing circuit of FIG. 1 evaluates the state of the memory cell A by an EVAL signal provided to transistors M in legs B and C, and to a word line driver coupled to the memory cell selection transistor. Memory cell A is read by providing an elevated voltage above VDD to the cell. In the preferred implementation 1.3 Volts is used, whereas the power supply for the sense amplifier J and other logic on the semiconductor typically use a VDD of about 0.8 Volts.

Bit line R is an optional connection. If a particular application for the circuit of FIG. 1 demands faster speed, bit line R may be used to match with the capacitance of the OTP memory cell bit-line, giving a matched AC response into the sense amplifier, which can help to optimize speed.

FIG. 2 illustrates clocking of the EQ and EVAL signals used to control reading of memory cell A. The top of the diagram in FIG. 2 illustrates the clock (CLK) signal and other input signals used to control the read of the OTP. The RE clock is used to mark the beginning of a read cycle, and the decoding address selects the appropriate memory cell to be read. The output data clock is the output data generated by the differential sense amplifier J (FIG. 1). The internal signals EQ, EVAL and LT are derived from the CLK signal using well known logic circuitry (not shown). The signal EQ implements the 'Equalization' phase of the sensing, while the EVAL signal drives the data sensing operation. In a typical implementation, the output (Data Out) from the sense amplifier J is fed to a digital latch. The signal LT shown in FIG. 2 is used to capture the sense data in the latch.

The EVAL signal is provided to node S of FIG. 1. When EVAL is at logic 0, the EVAL signal equalizes the sense amplifier by coupling each of legs B and C to the sense amplifier input terminals and developing a common voltage at the input terminals. At the same time signal EQ may be used to further equalize the internal nodes of the sense amplifier, if required, using additional circuitry, not shown. When EVAL is logic 0, transistors M in matched legs B and C are on. The currents in legs B and C flow through matched linear loads H, thus developing a bias voltage of about 0.1 Volts at each of nodes BL-data and BL-ref. This is the 'Equalization' phase of the sensing operation, and the sense amplifier J output is thus indeterminate at this time. During this time, leg D is off. Leg D is off because the WLR word line controlling the memory cell read selection transistor is at 0 Volts, thus no current flows in the memory cell A.

The signal EVAL, which rises on the falling edge of EQ, disconnects leg C from the data input terminal of the sense amplifier, and connects the bit line of memory cell A to that terminal of the differential sense amplifier J. When EVAL switches to logical on (1), (the Evaluate condition), transistor M in leg C is turned off, however device M in leg B remains on, maintaining the 0.1V reference level at BL-ref. The memory cell leg D is turned on, enabling the possible flow of 3 uA from leg D into the memory cell. The 3 uA will flow if the cell is programmed on (state '1'), but the current in leg D will remain at 0 uA if the cell is not programmed on (state '0').

This allows the sense amplifier J to sense the state of memory cell A. If the memory cell A is in state '1', the voltage at BL-data will rise above BL-ref. In worst-case simulations, there is about a +80 mV increase above the BL-ref. This is an adequate signal to force the differential sense amplifier J to output a '1' state. On the other hand, if the memory cell is in state '0', no current flows, and BL-data will fall to 0V. This causes approximately a −100 mV differential input to the sense amp. This is more than adequate signal to force the differential sense amp to output a '0' state. In a typical implementation, a well-known latch circuit receives the Data Out signal from amplifier J and latches the data in response to a signal LT shown in FIG. 2.

In the implementation shown, simulations show about 6.6 uW of power being consumed during a sense cycle. This is the sum of the power from the VDD and 1.3V supplies. The sense cycle is 2 periods of an 80 ns clock (CLK). Scaling the bias currents mentioned may reduce this power consumption further. The trade off, however, is that a slower Read clock is needed as the power is reduced, lowering the data rate of the Read operation. For systems operating with very low power, this is typically not a concern.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A circuit for reading data from one-time programmable memory cells, each cell connected to a program word line, a read word line and a bit line, the circuit comprising:
   a first bias circuit and a second bias circuit, each coupled between a first higher potential and a second lower potential for providing first and second mirrored reference currents between the first higher potential and the second lower potential, the first bias circuit being coupled to a reference terminal of a differential sense amplifier and the second bias circuit being coupled to a data terminal of the differential sense amplifier, the first and second bias circuits equilibrating the differential sense amplifier in response to a control signal having a first logic state;
   a third bias circuit coupled between the first higher potential and the program word line for providing a limited current to the program word line; and
   a read word line driver circuit coupled to the read word line, and coupled to receive the control signal, whereby when the control signal is in a logic state opposite the first logic state, the memory cell is coupled to the data terminal of the differential sense amplifier and current through the memory cell is limited by the third bias circuit.

2. The circuit as in claim 1 wherein the control signal disconnects the second bias circuit from the data terminal when the control signal is in a logic state opposite the first logic state.

3. The circuit as in claim 1 wherein each of the first and second bias circuits is coupled to the second lower potential through a load circuit.

4. The circuit as in claim 2 wherein:
   the first bias circuit comprises a first PMOS and a first NMOS transistor serially connected with a gate electrode of one of the first PMOS and the first NMOS transistor being coupled to a common node; and
   the second bias circuit comprises a second PMOS and a second NMOS transistor serially connected with a gate electrode of one of the second PMOS and the second NMOS transistor being coupled to the common node, and a gate electrode of the other of the second PMOS and the second NMOS transistor being coupled to receive the control signal.

5. The circuit as in claim 4 wherein:
   the first and second PMOS transistors are coupled to the common node;
   the first NMOS transistor is coupled to the reference terminal of the differential sense amplifier; and
   the second NMOS transistor is coupled to the data terminal of the differential sense amplifier.

6. The circuit as in claim 4 wherein the third bias circuit comprises at least one transistor having a gate coupled to the common node and another electrode coupled to the program word line.

7. The circuit as in claim 6 wherein the third bias circuit comprises a plurality of parallel connected transistors having commonly connected electrodes.

8. The circuit as in claim 1 further comprising a fourth bias circuit coupled between the first higher potential and the second lower potential for establishing a reference current between the first higher potential and the second lower potential, the reference current being mirrored by the first, second, and third bias circuits.

9. The circuit as in claim 1 further comprising a fifth bias circuit coupled to the differential sense amplifier.

10. A method of reducing power consumption in a circuit for reading a memory cell coupled to a read word line, a program word line, a bit line, and to a differential sense amplifier having a data terminal and a reference terminal, the method comprising:
    during an equalization phase, coupling a first potential to the reference terminal and a second potential to the data terminal, the first and second potentials being substantially the same potential;
    during an evaluation phase, disconnecting the second potential from the data terminal, and then coupling a current limited path to the memory cell, the current limited path establishing a potential to the memory cell which limits current to the memory cell while a read operation is performed.

11. The method as in claim 10 wherein the method further comprises during the evaluation phase:
    coupling the current limited path to the program word line; and
    providing a control signal to the read word line, whereby if the memory cell is in a first state a first signal is provided to the data terminal to substantially change potential of the data terminal relative to the reference terminal, and if the memory cell is in an opposite state to substantially change potential of the data terminal relative to the reference terminal in the opposite direction.

12. The method as in claim 11 further comprising using mirrored current paths to generate the first potential and the second potential.

13. The method as in claim 11 wherein the step of providing a control signal comprises coupling the control signal to control the second bias circuit.

* * * * *